United States Patent
Sonoda et al.

(10) Patent No.: US 9,880,431 B2
(45) Date of Patent: Jan. 30, 2018

(54) DISPLAY DEVICE

(71) Applicant: Japan Display Inc., Minato-ku (JP)

(72) Inventors: Daisuke Sonoda, Tokyo (JP); Tatsuya Ide, Tokyo (JP); Rintaro Makino, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/380,459

(22) Filed: Dec. 15, 2016

(65) Prior Publication Data

US 2017/0176803 A1    Jun. 22, 2017

(30) Foreign Application Priority Data

Dec. 18, 2015    (JP) .................................. 2015-247453

(51) Int. Cl.
| | |
|---|---|
| *G02F 1/1343* | (2006.01) |
| *G02F 1/133* | (2006.01) |
| *G02F 1/1333* | (2006.01) |
| *G02F 1/1362* | (2006.01) |
| *H01L 27/12* | (2006.01) |

(52) U.S. Cl.
CPC ...... *G02F 1/13439* (2013.01); *G02F 1/13306* (2013.01); *G02F 1/13338* (2013.01); *G02F 1/136286* (2013.01); *H01L 27/124* (2013.01); *H01L 27/1225* (2013.01); *G02F 2201/123* (2013.01)

(58) Field of Classification Search
CPC ............... H01L 27/124; H01L 27/1225; G02F 1/13306; G02F 1/13338; G02F 1/136286; G02F 1/13439; G02F 2201/123; G02F 2001/1357; G02F 2001/136218; G02F 2001/136295; G02F 2201/12; G02F 2201/121; G02F 1/0316; G02F 1/13409; G02F 1/155; G09G 2300/0421
See application file for complete search history.

(56) References Cited

U.S. PATENT DOCUMENTS 6,630,977 B1 * 10/2003 Yamazaki ......... G02F 1/134363
257/E21.413
9,059,297 B2 * 6/2015 Tochibayashi ...... H01L 29/7869

FOREIGN PATENT DOCUMENTS

WO    WO 2015/133041 A1    9/2015

* cited by examiner

*Primary Examiner* — Joseph L Williams
*Assistant Examiner* — Jose M Diaz
(74) *Attorney, Agent, or Firm* — Oblon, McClelland, Maier & Neustadt, L.L.P.

(57) ABSTRACT

According to one embodiment, a display device includes a stacked conductive layer. The stacked conductive layer includes a first conductive layer formed of material containing aluminum, and a second conductive layer provided on the first conductive layer, formed of material different from material of which the first conductive layer is formed, and having a higher visible-light absorptivity than that of the first conductive layer. The first conductive layer includes a side wall formed of an oxide film.

20 Claims, 14 Drawing Sheets

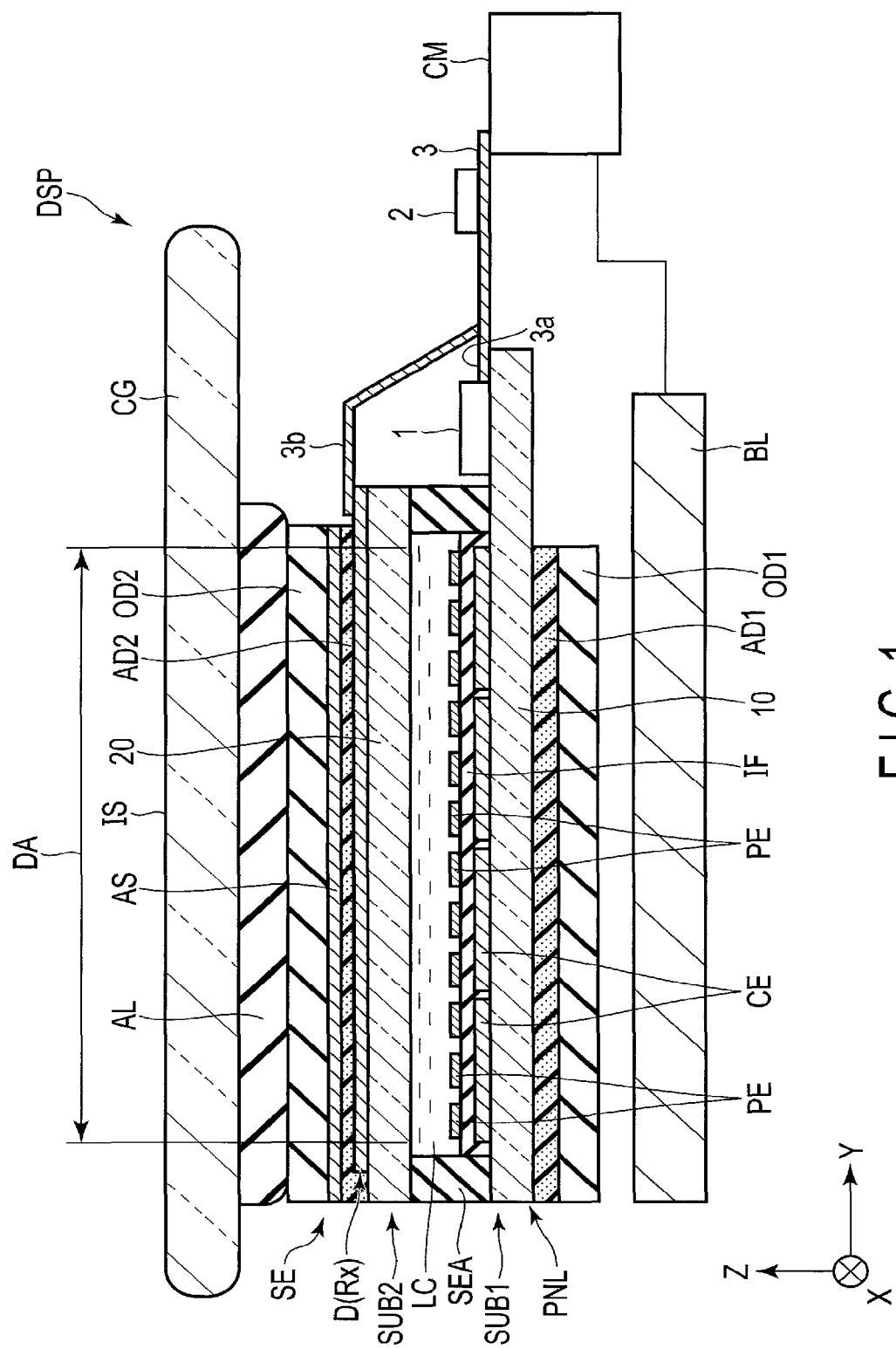
F I G. 1

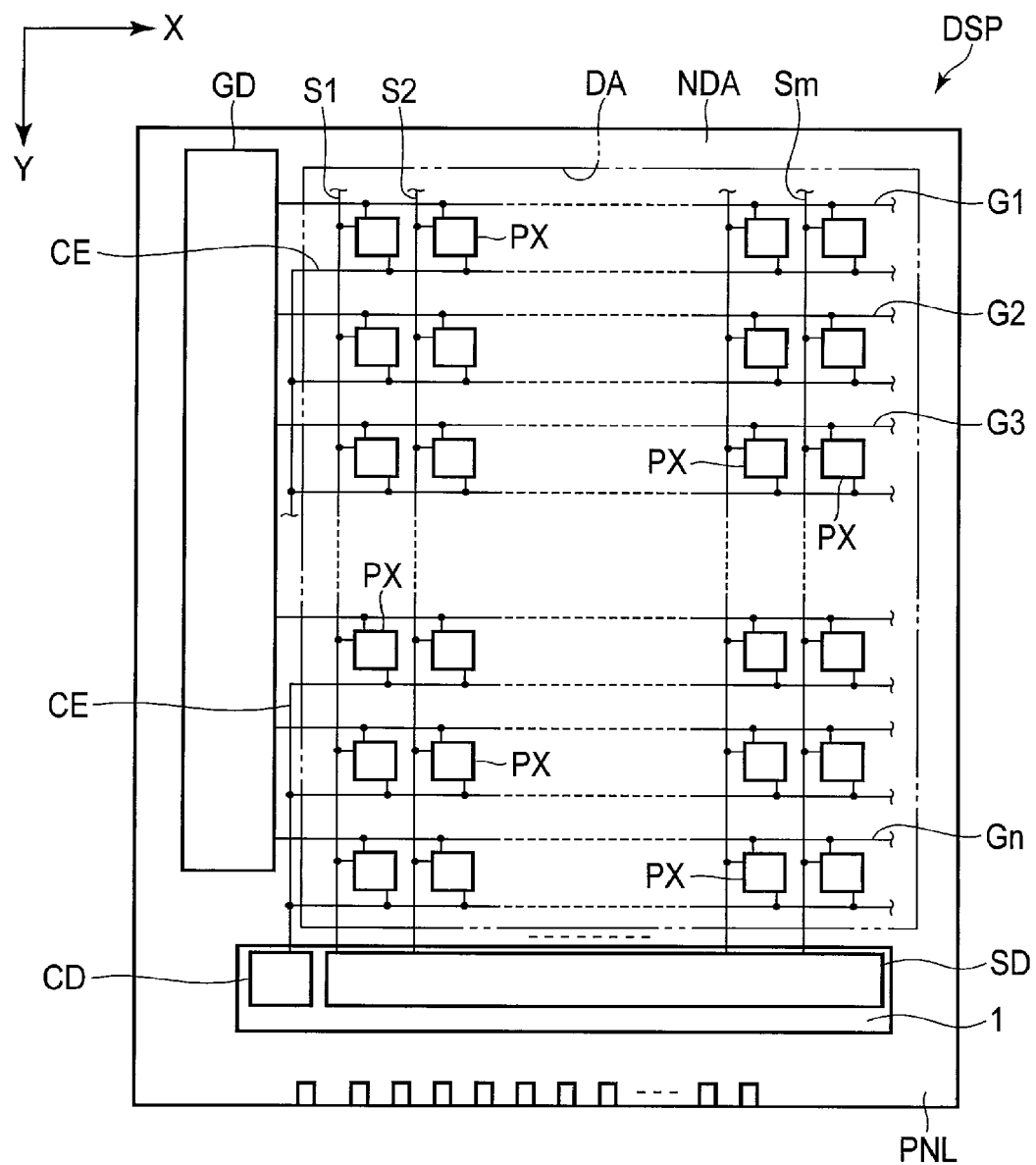
F I G. 3

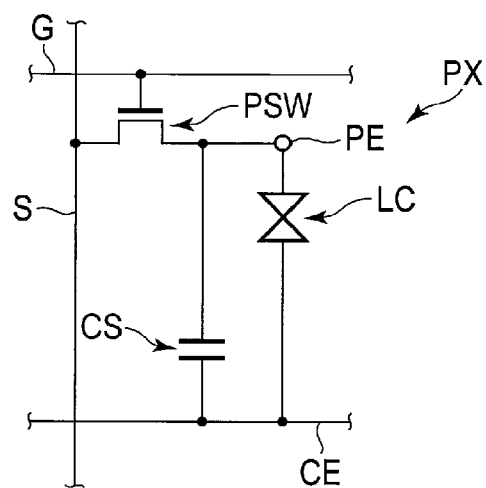
F I G. 4

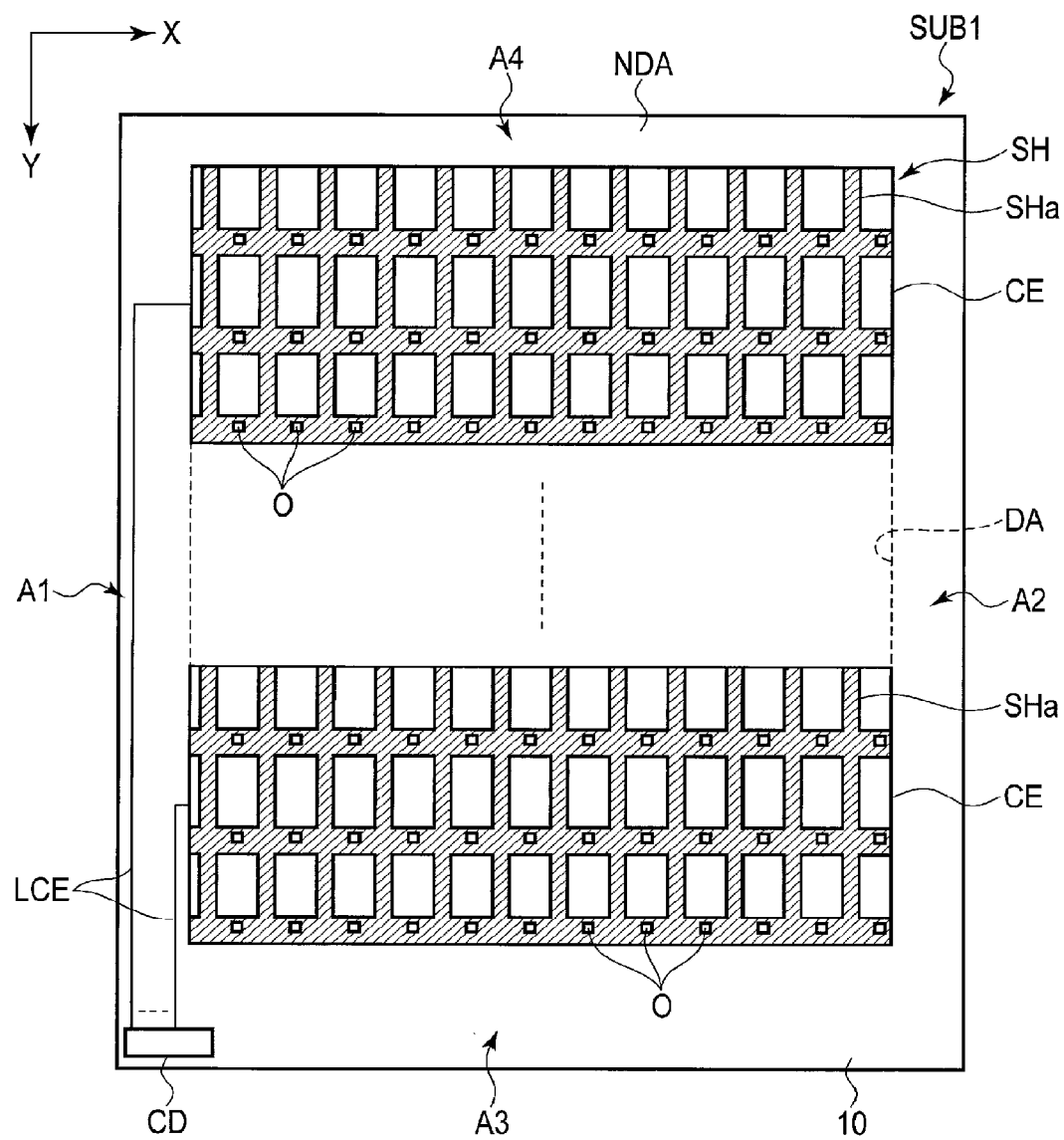
F I G. 7

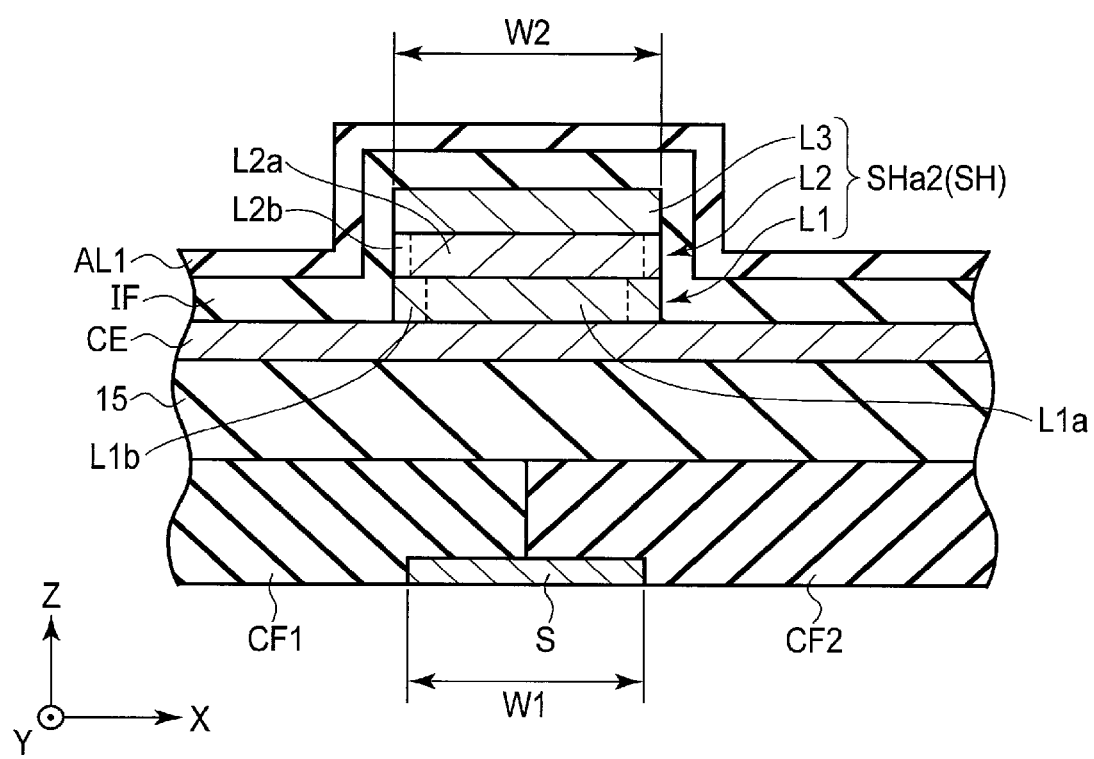
F I G. 10

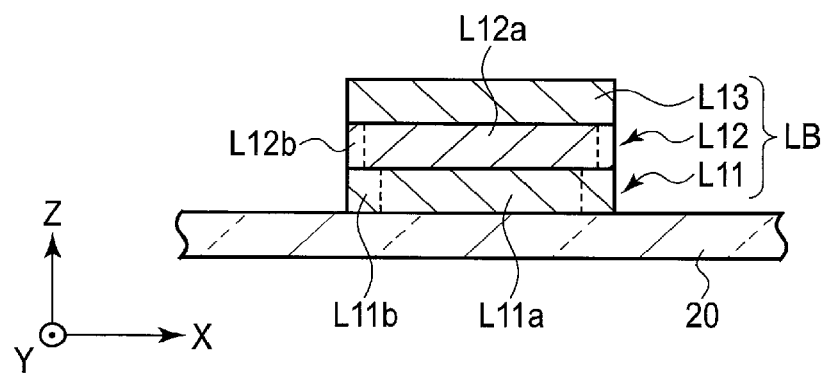
F I G. 12
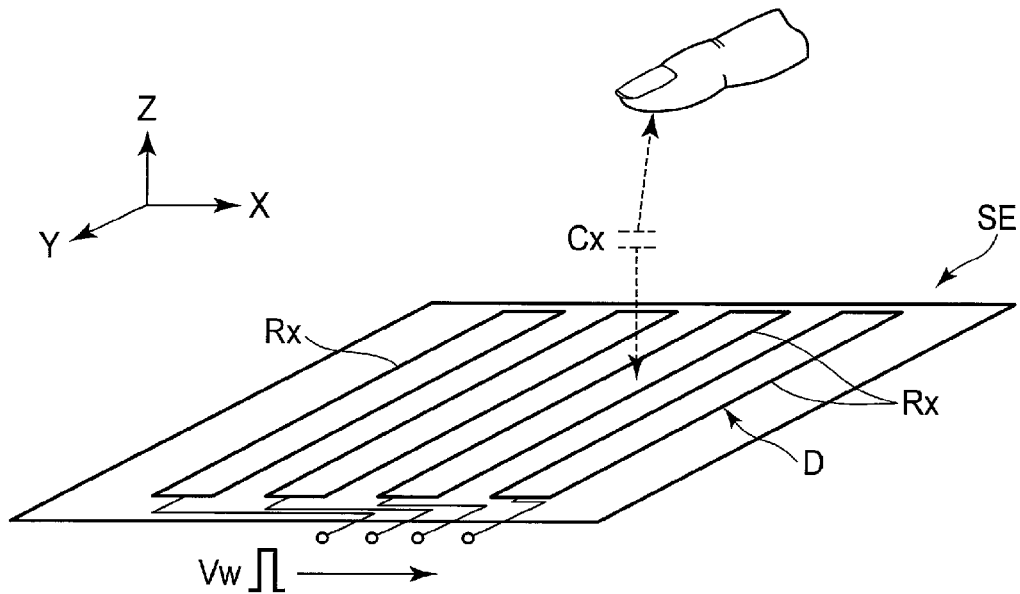
F I G. 13

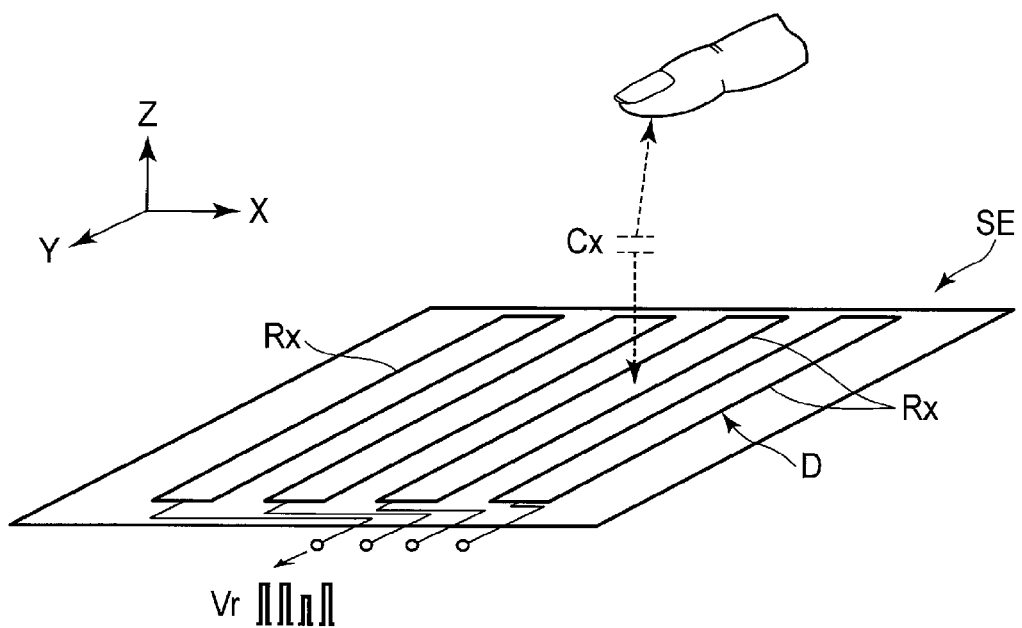
F I G. 14

DISPLAY DEVICE

CROSS-REFERENCE TO RELATED APPLICATIONS

This application is based upon and claims the benefit of priority from Japanese Patent Application No. 2015-247453, filed Dec. 18, 2015, the entire contents of which are incorporated herein by reference.

FIELD

Embodiments described herein relate generally to a display device.

BACKGROUND

In general, as a display device, a liquid crystal display device is known. The liquid crystal display device uses various conductive layers. As the conductive layers, lines extending in a display area for displaying an image are present. The reflectances of such lines can be reduced if they are blacked. As a result, they can become visibly unrecognizable.

Also, as the above conductive layers, lines located outside of a liquid crystal display panel are present. Such lines are easily damaged by water contained in the outside air, as compared with lines located in the liquid crystal display panel. Thus, there is a case where it is demanded that lines having high resistance to corrosion be formed.

Furthermore, as the above conductive layers, lines having a stacked structure formed of a plurality of kinds of materials are present. In such lines, when electrical conduction is carried out in a high temperature and humidity environment, electrolytic corrosion easily occurs, and easily causes a failure of the lines such as breaking of them.

BRIEF DESCRIPTION OF THE DRAWINGS

FIG. 1 is a cross-sectional view illustrating a configuration of a liquid crystal display device according to an embodiment.

FIG. 3 is a view illustrating an equivalent circuit and a basic configuration of the liquid crystal display device as illustrated in FIG. 1.

FIG. 4 is an equivalent-circuit diagram illustrating each of pixels as illustrated in FIG. 3.

FIG. 7 is still another plan view illustrating the first substrate, and also a view illustrating a first insulating substrate, common electrodes, the line group, a plurality of lead lines and a common-electrode drive circuit.

FIG. 10 is an enlarged cross-sectional view illustrating part of the first substrate as illustrated in FIG. 8.

FIG. 12 is an enlarged cross-sectional view illustrating part of a second substrate as illustrated in FIG. 11.

FIG. 13 is a view for explaining a principle of an example of a sensing method in a first mode.

FIG. 14 is another view for explaining the principle of the example of the sensing method in the first mode, following FIG. 13.

DETAILED DESCRIPTION

Figure 2:
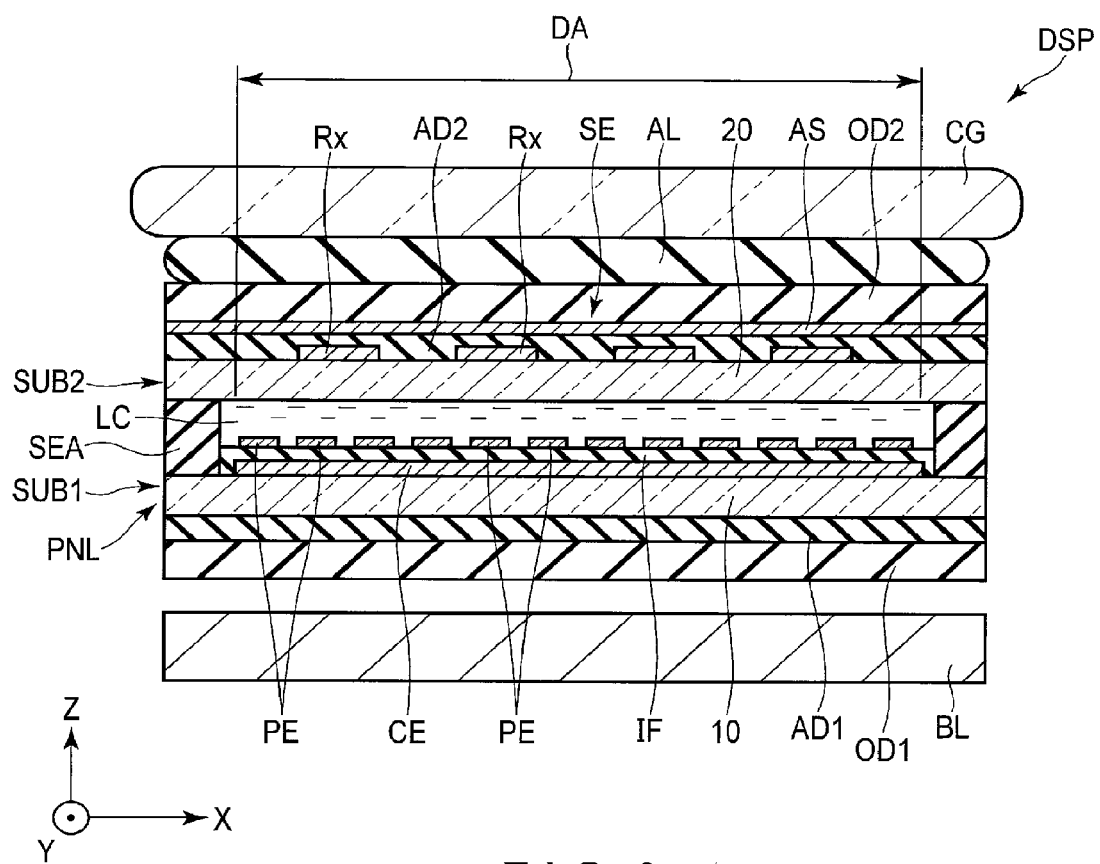
FIG. 2 is another cross-sectional view illustrating the configuration of the liquid crystal display device as illustrated in FIG. 1.

In general, according to one embodiment, there is provided a display device comprising: a stacked conductive layer, the stacked conductive layer comprising: a first conductive layer formed of material containing aluminum; and a second conductive layer provided on the first conductive layer, formed of material different from material of which the first conductive layer is formed, and having a higher visible-light absorptivity than that of the first conductive layer, the first conductive layer including a side wall formed of an oxide film.

According to another embodiment, there is provided a display device comprising: a stacked conductive layer, the stacked conductive layer comprising: a first conductive layer formed of material containing aluminum; a second conductive layer provided on the first conductive layer, formed of material different from material of which the first conductive layer is formed, and having a higher visible-light absorptivity than that of the first conductive layer, the first conductive layer including a side wall having a higher oxygen concentration than that of a center portion of the first conductive layer.

An embodiment will be described hereinafter with reference to the accompanying drawings. The disclosure is a mere example, and arbitrary change of gist which can be easily conceived by a person of ordinary skill in the art naturally falls within the inventive scope. To better clarify the explanations, the drawings may pictorially show width, thickness, shape, etc., of each portion as compared with an actual aspect, but they are mere examples and do not restrict the interpretation of the invention. In the present specification and drawings, after structural elements are each explained once with reference to the drawings, there is a case where their explanations will be omitted as appropriate, and those identical to or similar to the explained structural elements will be denoted by the same reference numbers, respectively, as the explained structural elements.

First of all, a display device will be described. The following explanation is given with respect to the case where in the embodiment, the display device is a sensor-equipped liquid crystal display device. FIG. 1 is a cross-sectional view illustrating a configuration of the liquid crystal display device according to the embodiment.

As illustrated in FIG. 1, a liquid crystal display device DSP comprises an active-matrix liquid crystal display panel PNL, a driver IC 1 which drives the liquid crystal display panel PNL, a cover member CG, a first optical element OD1, a second optical element OD2, a detection unit D, a driver IC 2 which drives the liquid crystal display panel PNL and the detection unit D, a backlight unit BL which illuminates the liquid crystal display panel PNL, a control module CM, and a flexible printed circuit 3.

The liquid crystal display panel PNL comprises a first substrate SUB1, a second substrate SUB2 and a liquid crystal layer LC, the first substrate SUB1 being flat-shaped, the second substrate SUB2 being flat-shaped and located opposite to the first substrate SUB1, the liquid crystal layer LC being held between the first substrate SUB1 and the second substrate SUB2. The liquid crystal display panel PNL includes a display area (active area) DA which displays an image. In a region located outward of the display area DA, the first substrate SUB1 and the second substrate SUB2 are joined to each other by a sealing member SEA. For example, the first substrate SUB1 is formed using a first insulating substrate 10 having a light transmissivity, such as a glass substrate or a resin substrate. The first substrate SUB1 comprises a plurality of common electrodes CE, a plurality of pixel electrodes PE, an insulating film IF, etc., on a side of the first insulating substrate 10 which faces the second substrate SUB2, the insulating film IF being interposed between the common electrodes CE and the pixel electrodes PE. The common electrodes CE and the pixel electrodes PE are formed of transparent conductive material such as indium tin oxide (ITO), an indium zinc oxide (IZO) or a zinc oxide (ZnO). The common electrodes CE are arranged and spaced from each other in a second direction Y. The second substrate SUB2 is formed using a second insulating substrate 20 having a light transmissivity, such as a glass substrate or a resin substrate.

It should be noted that the liquid crystal display panel PNL has a structure adapted for a fringe field switching (FFS) mode which is a display mode; however, it may have a structure adapted for another display mode. For example, the liquid crystal display panel PNL may have a structure adapted for an in-plane switching (IPS) mode such as the FFS mode, which primarily utilizes a lateral electric field substantially parallel to main surfaces of the substrates. In a display mode utilizing a lateral electric field, it is possible to apply a structure in which pixel electrodes PE and common electrodes CE are provided, for example, in the first substrate SUB1. Alternatively, the liquid crystal display panel PNL may have a structure adapted for a mode primarily utilizing a vertical electric field produced between the main surfaces of the substrates, such as a twisted nematic (TN) mode, an optically compensated bend (OCB) mode, a vertical aligned (VA) mode or the like. In the display mode utilizing the vertical electric field, for example, a structure in which pixel electrodes PE are provided in the first substrate SUB1, and common electrodes CE are provided in the second substrate SUB2 can be applied. It should be noted that the above main surfaces of the substrates are surfaces parallel to an X-Y plane defined in a first direction X and the second direction Y, which intersect each other.

In the embodiment, the first direction X and the second direction Y are perpendicular to each other; however, they may intersect each other at an angle other than 90°. Also, a third direction Z is perpendicular to each of the first direction X and the second direction Y. The third direction Z corresponds to a thickness direction of the liquid crystal display panel PNL.

In the following explanation, it is assumed that a direction from the first substrate SUB1 toward the second substrate SUB2 is an upward direction, and a direction from the second substrate SUB2 toward the first substrate SUB1 is a downward direction. Also, in the following, the phrase "as seen in plan view" means viewing from an upper position than the second substrate SUB2 toward the first substrate SUB1. Furthermore, in the following, with respect to the phrases "formed above" and "formed below", for example, in descriptions and recitations to the effect that element I is formed above or below element II, they suggest that element I is separated from element II; however, element I may be in contact with element II. Also, in the case where element I is separated from element II, element III may be interposed between elements I and II. Also, in the following, with respect to the phrases "formed on" and "formed under", in descriptions and recitations to the effect that element I is formed on or under element II, they suggest that element I is in contact with element II.

With respect to the embodiment, the first substrate SUB1 can be restated as an array substrate, and the second substrate SUB2 can be as a counter-substrate. The liquid crystal display panel PNL is a transmissive liquid crystal display panel which has a transmissive display function of selectively transmitting light incident from the backlight unit BL to display an image. It should be noted that the liquid crystal display panel PNL may be a transflective liquid crystal display panel which has, in addition to the transmissive display function, a reflective display function of selectively reflecting external light to display an image.

The backlight unit BL is provided on a rear surface side of the first substrate SUB1. As the structure of the backlight unit BL, various structures can be applied, and in the backlight unit BL, a light-emitting diode (LED) can be used as a light source. However, a detailed explanation of the structure of the backlight unit BL will be omitted. Also, it should be noted that in the case where the liquid crystal display panel PNL is a reflective liquid crystal display panel which has only a reflective display function, the backlight unit BL is omitted.

The cover member CG is located outward of the liquid crystal display panel PNL, and opposite to the second substrate SUB2. In the example illustrated in FIG. 1, an input surface IS of the liquid crystal display device DSP corresponds to a surface of the cover member CG. The liquid crystal display device DSP can detect the position of part of the input surface IS, with or to which a finger or the like is in contact with or proximity, to obtain position information. In the X-Y plane, the size of the cover member CG is greater than that of the second substrate SUB2 and greater than that of the first substrate SUB1. In the second direction Y, the cover member CG is longer than the second substrate SUB2 and longer than the first substrate SUB1. The cover member CG is formed of, for example, a glass substrate. In this case, there is a case where the cover member CG is referred to as a cover glass. Alternatively, the cover member CG can be formed using a substrate having a light transmissivity, such as a resin substrate.

The first optical element OD1 is disposed between the first insulating substrate 10 and the backlight unit BL. The first optical element OD1 is adhered to the first insulating substrate 10 by an adhesive AD1. The second optical element OD2 is located between the liquid crystal display panel PNL and the cover member CG. The second optical element OD2 is adhered to the second insulating substrate 20 and the detection unit D by an adhesive AD2. Each of the first optical element OD1 and the second optical element OD2 includes at least a polarizer, and may include a retardation film as occasion demands. An absorption axis of the polarizer included in the first optical element OD1 and that of the polarizer included in the second optical element OD2 cross each other. For example, the absorption axes of these polarizers are perpendicular to each other.

In order to prevent the second optical element OD2 from being charged, an antistatic layer AS is provided between the second optical element OD2 and the adhesive AD2. However, it suffices that the antistatic layer AS is provided as occasion arises.

The cover member CG is joined to the second optical element OD2 by an adhesive layer AL. For example, the adhesive layer AL is formed in the following manner: the cover member CG or the second optical element OD2 is coated with an optical elastic resin (super view resin [SVR]); the cover member CG and the second optical element OD2 are joined to each other in such as way as to hold the optical elastic resin, thereby forming an optical elastic resin film; and the optical elastic resin film is cured, thereby forming the adhesive layer AL.

The detection unit D is located between the common electrodes CE and the second optical element OD2 (polarizer). In the embodiment, the detection unit D is located above a surface of the second insulating substrate 20 which faces the second optical element OD2. Thus, the detection unit D may be in contact with the second insulating substrate 20, or be separated from the second insulating substrate 20. In the case where the detection unit D is separated from the second insulating substrate 20, an insulating film or the like (not shown) is interposed between the second insulating substrate 20 and the detection unit D. In the embodiment, an insulating film is interposed between the detection unit D and the second insulating substrate 20. The detection unit D includes detection electrodes Rx extending in the second direction Y, etc. It should be noted that the detection unit D also has a function of causing charge accumulated in the antistatic layer AS to escape therefrom to the outside.

The common electrodes CE and the detection unit D form a capacitance sensor SE. The common electrodes CE function as electrodes for display, and also as drive electrodes for sensing.

The driver IC 1 is mounted on the first substrate SUB1 of the liquid crystal display panel PNL. The flexible printed circuit 3 is connected to the control module CM. The flexible printed circuit 3 includes a first branch portion 3a and a second branch portion 3b. The first branch portion 3a is connected to the liquid crystal display panel PNL. The second branch portion 3b is connected to the detection unit D. The driver IC 2 is mounted on the flexible printed circuit 3.

The driver IC 1 and the driver IC 2 are connected to each other by the flexible printed circuit 3, etc. It should be noted that means for connecting the control module CM, the liquid crystal display panel PNL and the detection unit D to each other can be variously modified. For example, instead of the flexible printed circuit 3, two flexible printed circuits, i.e., a first flexible printed circuit and a second flexible printed circuit, which are independently provided, can be applied. In this case, it is possible that the first flexible printed circuit connects the control module CM and the liquid crystal display panel PNL to each other, and the second flexible printed circuit connects the control module CM and the detection unit D to each other. For example, the driver IC 2 can be mounted on either the first flexible printed circuit or the second flexible printed circuit.

The control module CM, the driver IC 1 and the driver IC 2 function as a controller for controlling the sensor SE. The control module CM can be restated as an application processor. The driver IC 2 can supply a timing signal to the driver IC 1, the timing signal indicating time at which the sensor SE is to be driven. Alternatively, the driver IC 1 can supply a timing signal to the driver IC 2, the timing signal indicating time at which the common electrodes CE, which are to be described later, are to be driven. Still alternatively, the control module CM can supply timing signals to the driver IC 1 and the driver IC 2, respectively. By supplying these timing signals, a driving operation of the driver IC 1 and that of the driver IC 2 can be synchronized with each other.

It should be noted that the control module CM is connected to the backlight unit BL, and controls driving of the backlight unit BL.

FIG. 2 is another cross-sectional view illustrating the configuration of the liquid crystal display device DSP as illustrated in FIG. 1. It should be noted that FIG. 1 illustrates a cross section parallel to the Y-Z plane, whereas FIG. 2 illustrates a cross section parallel to the X-Z plane.

As illustrated in FIG. 2, the common electrodes CE extend in the first direction X. The detection electrodes Rx extend in the second direction Y, and intersect with the common electrodes CE.

FIG. 3 is a view illustrating an equivalent circuit and a basic configuration of the liquid crystal display device DSP as illustrated in FIG. 1.

As illustrated in FIG. 3, the liquid crystal display panel PNL includes a scanning-line drive circuit GD which is located in a non-display area NDA located outside the display area DA. The driver IC 1 is also located in the non-display area NDA. In the embodiment, the driver IC 1 comprises the signal-line drive circuit SD and the common-electrode drive circuit CD. It should be noted that the driver IC 1 may include at least part of the signal-line drive circuit SD and the common-electrode drive circuit CD. The non-display area NDA is formed in the shape of a rectangular frame surrounding the display area DA.

The liquid crystal display panel PNL comprises a plurality of pixels PX in the display area DA. The pixels PX are arranged in a matrix in the first direction X and the second direction Y; that is, m×n pixels X are provided (m and n are positive integers). Also, in the display area DA, the liquid crystal display panel PNL comprises n scanning lines G (G1 to Gn), m signal lines S (S1 to Sm), the common electrodes CE, etc.

The scanning lines G substantially linearly extend in the first direction X to the outside of the display area DA, and are connected to the scanning-line drive circuit GD. Also, the scanning lines G are arranged and spaced from each other in the second direction Y. The signal lines S substantially linearly extend in the second direction Y to the outside of the display area DA, and are connected to the signal-line drive circuit SD. Furthermore, the signal lines S are arranged and spaced from each other in the first direction X, and intersect with the scanning lines G. The common electrodes CE are provided at least in the display area DA, and electrically connected to the common-electrode drive circuit CD. Each of the common electrodes CE is shared among associated pixels PX.

In the embodiment, any three pixels PX arranged in the first direction X are a red pixel, a green pixel and a blue pixel, respectively, and form a single main pixel. The pitch of pixels PX in the second direction Y is constant, and for example, approximately 50 to 150 µm. The pitch of pixels PX in the first direction X is also constant, and for example, one third of the pitch of the pixels PX in the second direction Y.

FIG. 4 is an equivalent-circuit diagram illustrating each of the pixels PX as illustrated in FIG. 3.

As illustrated in FIG. 4, each pixel PX comprises a pixel switching element PSW, a pixel electrode PE, a common electrode CE, a liquid crystal layer LC, etc. The pixel switching element PSW is formed of, for example, a thin-film transistor. The pixel electrode PE is electrically connected to the pixel switching element PSW. The pixel electrode PE is located opposite to the common electrode CE. The common electrode CE, an insulating film (the above insulating film IF) and the pixel electrode PE provide a holding capacitance CS.

Figure 5:
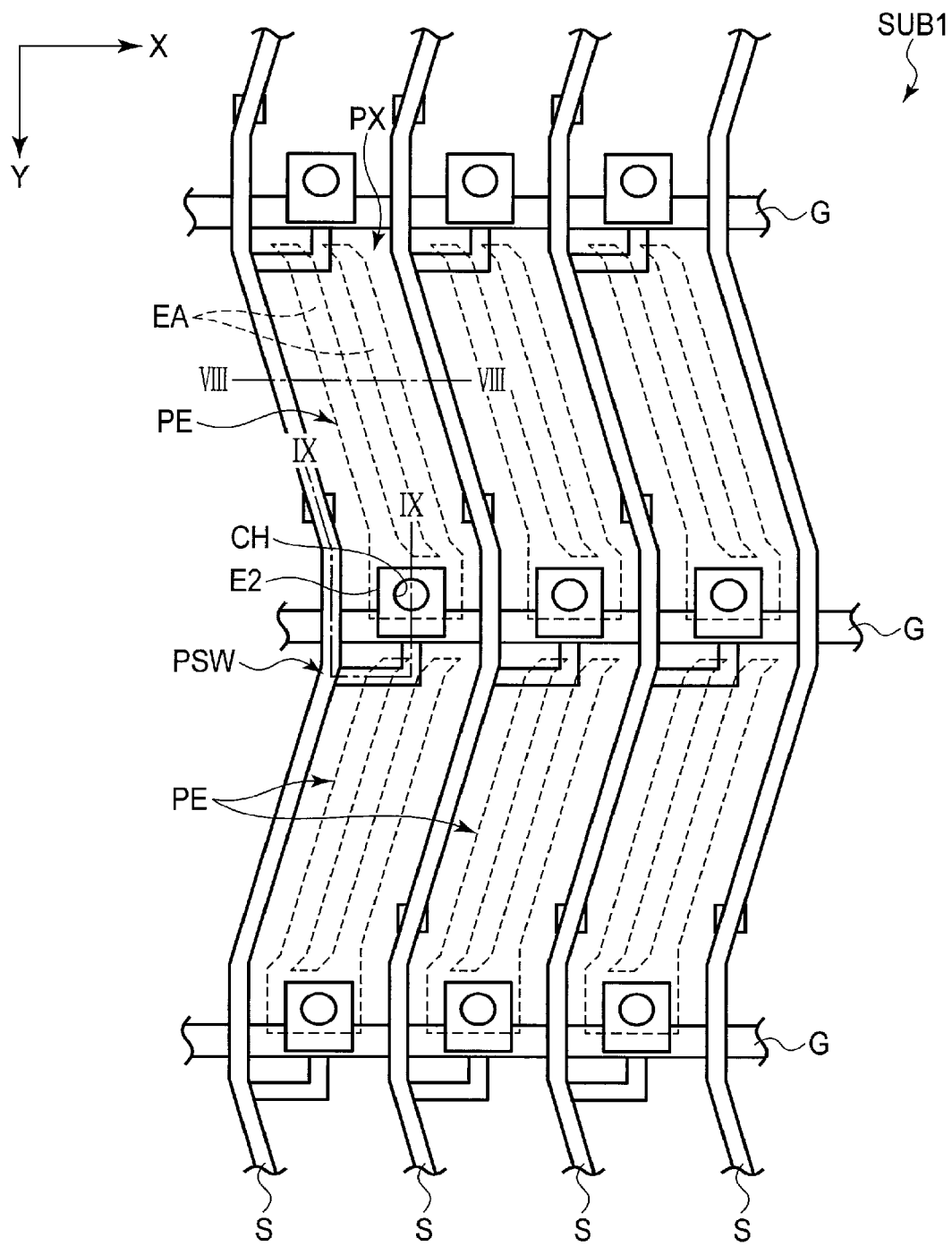
FIG. 5 is an enlarged plan view illustrating part of a first substrate as illustrated in FIGS. 1 and 2, and also a view illustrating scanning lines, signal lines, pixel switching elements, second electrodes, contact holes and pixel electrodes.

FIG. 5 is an enlarged plan view illustrating part of the first substrate SUB1 as illustrated in FIGS. 1 and 2, and also a view illustrating scanning lines G, signal lines S, pixel switching elements PSW, second electrodes E2, contact holes CH and pixel electrodes PE. It should be noted that FIG. 5 illustrates only structural elements which need to be referred to in the following explanation, and omits the common electrodes CE, etc.

As illustrated in FIG. 5, a plurality of scanning lines G linearly extend in the first direction X. It should be noted that the scanning lines G need not always linearly extend; i.e., they may be partially bent. A plurality of signal lines S extend substantially in the second direction Y, and are partially bent. In the example illustrated in FIG. 5, between any adjacent two of the scanning lines G, signal lines S extend in a direction other than the first direction X and the second direction Y. The signal lines S may linearly extend in the second direction Y. Referring to FIG. 5, each of pixels PX corresponds to an area defined by associated two adjacent scanning lines G and associated two adjacent signal lines S.

The pixel switching elements PSW will be described later in detail. The second electrodes E2 are electrically connected to the pixel switching elements PSW, respectively. The pixel electrodes PE, as indicated by dashed lines in FIG. 5, are provided in the pixels PX, respectively. The pixel electrodes PE are electrically connected to the second electrodes E2, respectively. In the example illustrated in FIG. 5, each of the pixel electrodes PE includes two strip-shaped electrodes EA. The strip-shaped electrodes EA extend substantially parallel to associated signal lines S which are adjacent to each other in the first direction X. As seen in plan view, each of the contact holes CH is superimposed on both an associated second electrode E2 and an associated pixel electrode PE. Each contact holes CH is used to connect the pixel electrode PE to the second electrode E2.

Figure 6:
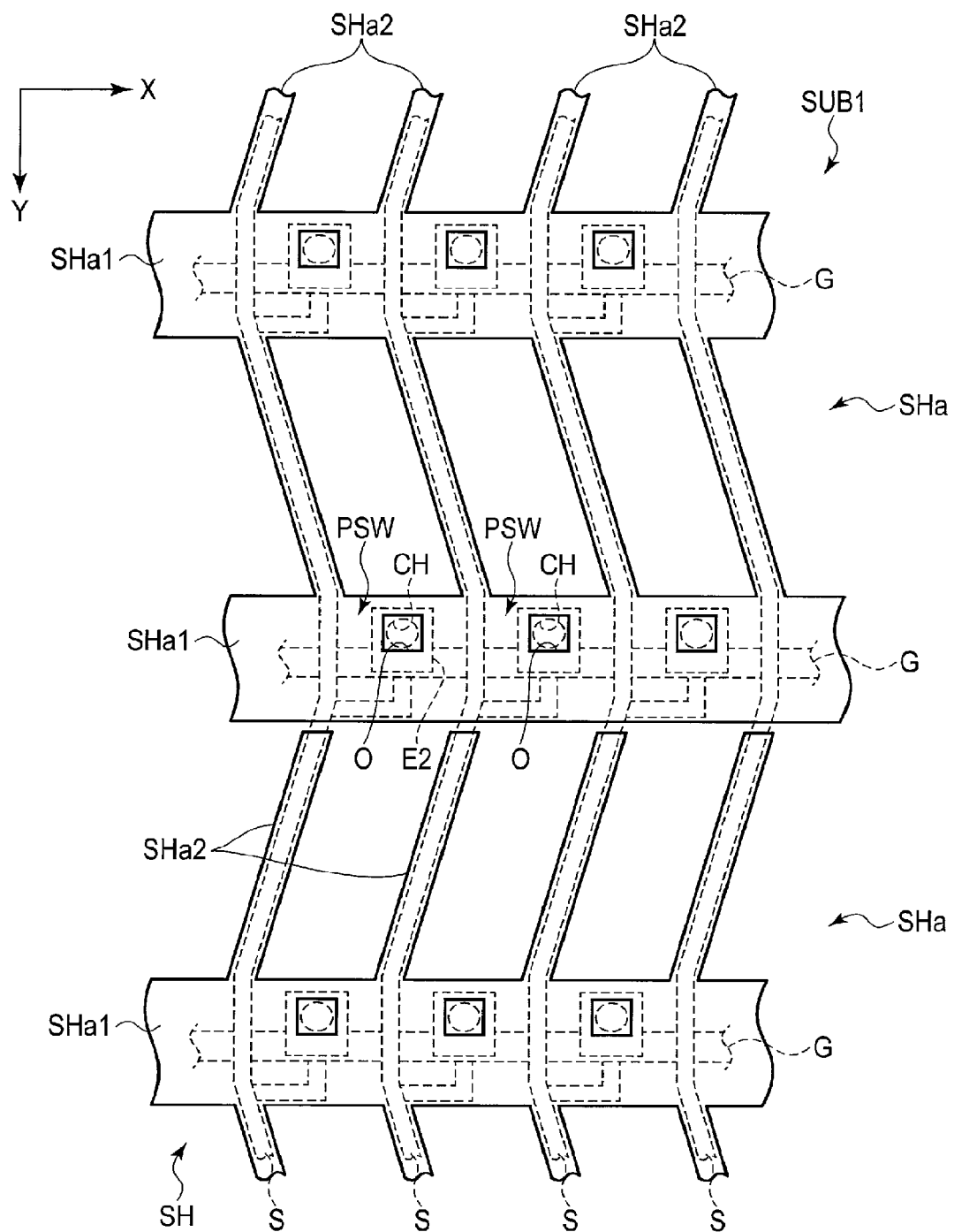
FIG. 6 is another enlarged plan view illustrating the part of the first substrate, and also a view illustrating a line group, openings, scanning lines, signal lines, pixel switching elements, second electrodes and contact holes.

FIG. 6 is an enlarged plan view illustrating part of the first substrate SUB1, and also a view illustrating a line group SH, openings O, scanning lines G, signal lines S, pixel switching elements PSW, second electrodes E2 and contact holes CH. It should be noted that FIG. 6 illustrates only structural elements which need to be referred to in the following explanation, and omits the common electrodes CE, etc.

As illustrated in FIG. 6, the first substrate SUB1 includes the line group SH. The line group SH is arranged in the second direction Y, and includes line portions SHa electrically insulated from each other. The line portions SHa comprise first lines SHa1 and second lines SHa2; that is, the first lines SHa1 and the second lines SHa2 are formed integral with each other to form the line portions SHa.

The first lines SHa1, as seen in plan view, extend along the scanning lines G, and are superimposed on the scanning lines G, respectively. In the embodiment, the first lines SHa1 are strip-shaped, and superimposed on the scanning lines G, pixel switching element PSW arranged in the first direction X, and second electrodes E2 arranged in the first direction X.

The first lines SHa1 each include a plurality of openings O. The openings O are in a one-to-one correspondence with the contact holes CH. Each of the openings O surrounds an associated contact hole CH, and contributes to electrical connection between an associated pixel electrode PE and an associated second electrode E2.

The second lines SHa2, as seen in plan view, extend along the signal lines S, and are superimposed on the signal lines S, respectively. As seen in plan view, the second lines SHa2 are separated from the pixel electrodes PE as illustrated in FIG. 5. Also, each of the second lines SHa2 covers at least part of an associated signal line S. In the embodiment, in the display area DA, second lines SHa2 arranged in the second direction Y cover associated signal lines S, except for gaps between them.

FIG. 7 is another view illustrating the first substrate SUB1, and also a view illustrating the first insulating substrate 10, the common electrodes CE, the line group SH, a plurality of lead lines LCE, and the common-electrode drive circuit CD.

As illustrated in FIG. 7, the common electrodes CE are strip-shaped, extend in the first direction X, and are arranged and spaced from each other in the second direction Y. In the embodiment, the common electrodes CE are located in the display area DA. However, their location is not limited to this; that is, they may extend such that portions of them reach the non-display area NDA.

The line portions SHa are in a one-to-one correspondence with the common electrodes CE. Each of the line portions SHa is stacked only on an associated common electrode CE, and electrically connected to the associated common electrode CE only. With respect to the positional relationship between the line portions SHa and the common electrodes CE, it suffices that each line portions SHa is not provided over a plurality of common electrodes CE. Thus, for example, line portions SHa adjacent to each other in the second direction Y may be stacked on a single common electrode CE. Furthermore, the openings O are formed not only in the line portions SHa but in the common electrodes CE, and contribute to electrical connection between the pixel electrode PE and the second electrode E2.

The lead lines LCE are located in the non-display area NDA, and electrically connect the common electrodes CE to the common-electrode drive circuit CD. In the embodiment, the lead lines LCE are connected to the common electrodes CE, respectively. The lead lines LCE may be formed of a transparent conductive material such as ITO, IZO or ZnO, like the common electrodes CE. Also, instead of the transparent conductive material, they may be formed of metal. Alternatively, the lead lines LCE are connected to the line portions SHa, respectively. In this case, the lead lines LCE and the line portions SHa may be formed of the same conductive material such as metallic material.

It is assumed that in the non-display area NDA, an area located leftward of the display area DA is a first area A1 (a strip-shaped area extending in the second direction Y), an area located rightward of the display area DA is a second area A2 (a strip-shaped area extending in the second direction Y), an area downward of the display area DA is a third area A3 (a strip-shaped area extending in the first direction X), and an area located upward of the display area DA is a fourth area A4 (a strip-shaped area extending in the first direction X). For example, the common-electrode drive circuit CD is located in the third area A3, in which the first branch portion 3a is located; and the lead lines LCE extend in the first area A1 and the third area A3.

Figure 8:
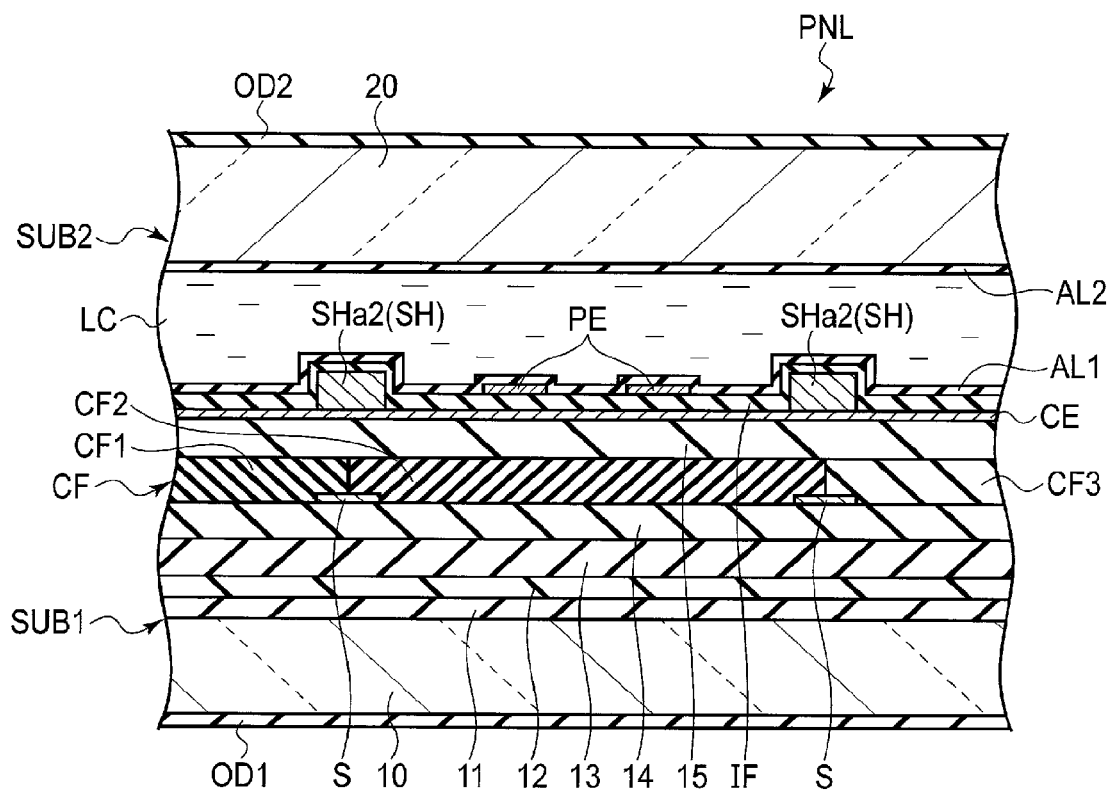
FIG. 8 is a cross-sectional view of a liquid crystal display panel, which is taken along line VIII-VIII in FIG. 5.

FIG. 8 is a cross-sectional view of the liquid crystal display panel PNL which is taken along line VIII-VIII in FIG. 5. It should be noted that FIG. 8 illustrates only structural elements which need to be referred to in the following explanation, and omits the adhesives AD1 and AD2, etc.

As illustrated in FIG. 8, the first substrate SUB1 comprises the first insulating substrate 10, insulating layers 11, 12, 13, 14 and 15, an insulating film IF, signal lines S, a color filter layer CF, a common electrode CE, pixel electrodes PE, second lines SHa2, an alignment film AL1, etc.

The first insulating substrate 10 is transparent, and for example, it is formed of glass such as a borosilicate glass. However, it may be formed of resin such as plastic. The insulating layers 11 to 15 and the insulating film IF are all transparent. The insulating layers 11 to 14 and the insulating film IF are inorganic insulating layers, and for example, they are formed of a silicon nitride or a silicon oxide. The insulating layer 15 is an organic insulating layer, and for example, it is formed of resin such as acrylic resin. The insulating layer 11 is located on the first insulating substrate 10. The insulating layer 12 is located on the insulating layer 11. The insulating layer 13 is located on the insulating layer 12. The insulating layer 14 is located on the insulating layer 13.

The signal lines S are located on the insulating layer 14.

The color filter layer CF is located on the insulating layer 14. The color filter layer CF includes, for example, a color filter CF1 colored red, a color filter CF2 colored green and a color filter CF3 colored blue. The color filter CF1 is formed of resin colored red, and is provided for red pixels. The color filter CF2 is formed of resin colored green, and is provided for green pixels. The color filter CF3 is formed of resin colored blue, and is provided for blue pixels. An adjacency between the color filters CF1 and CF2 and that between the color filters CF2 and CF3 are located on respective signal lines S.

The insulating layer 15 is located on the color filter layer CF.

The common electrode CE is located on the insulating layer 15. The common electrode CE extends over a plurality of pixels. In the example illustrated in FIG. 8, the common electrode CE extends such that it is continuously located just on the color filters CF1 to CF3 without disconnection just above the signal lines S.

The insulating film IF is located on the common electrodes CE.

In regions located just above the signal lines S, the second lines SHa2 (line group SH) are in contact with the common electrode CE. In the example illustrated in FIG. 8, the second lines SHa2 are located on the common electrode CE. For example, the second lines SHa2 are formed of metallic material such as aluminum. As in the example illustrated in FIG. 8, in the case where the second lines SHa2 (line group SH) are in contact with the common electrode CE, the resistance of the common electrode CE can be lowered.

The pixel electrodes PE are located on the insulating film IF. The pixel electrodes PE are provided in the pixels, respectively. The pixel electrodes PE are spaced from the second lines SHa2.

The alignment film AL1 covers the insulating film IF and the pixel electrodes PE.

The liquid crystal layer LC is located on the first substrate SUB1. The liquid crystal layer LC may be formed of either a positive liquid crystal material having a positive dielectric anisotropy or a negative liquid crystal material having a negative dielectric anisotropy.

The second substrate SUB2 is located on the liquid crystal layer LC. The second substrate SUB2 comprises the second insulating substrate 20, an alignment film AL2, etc.

The second insulating substrate 20 is transparent, and for example, it is formed of glass such as a borosilicate glass. However, it may be formed of resin such as plastic. The alignment film AL2 is formed under the second insulating substrate 20.

Figure 9:
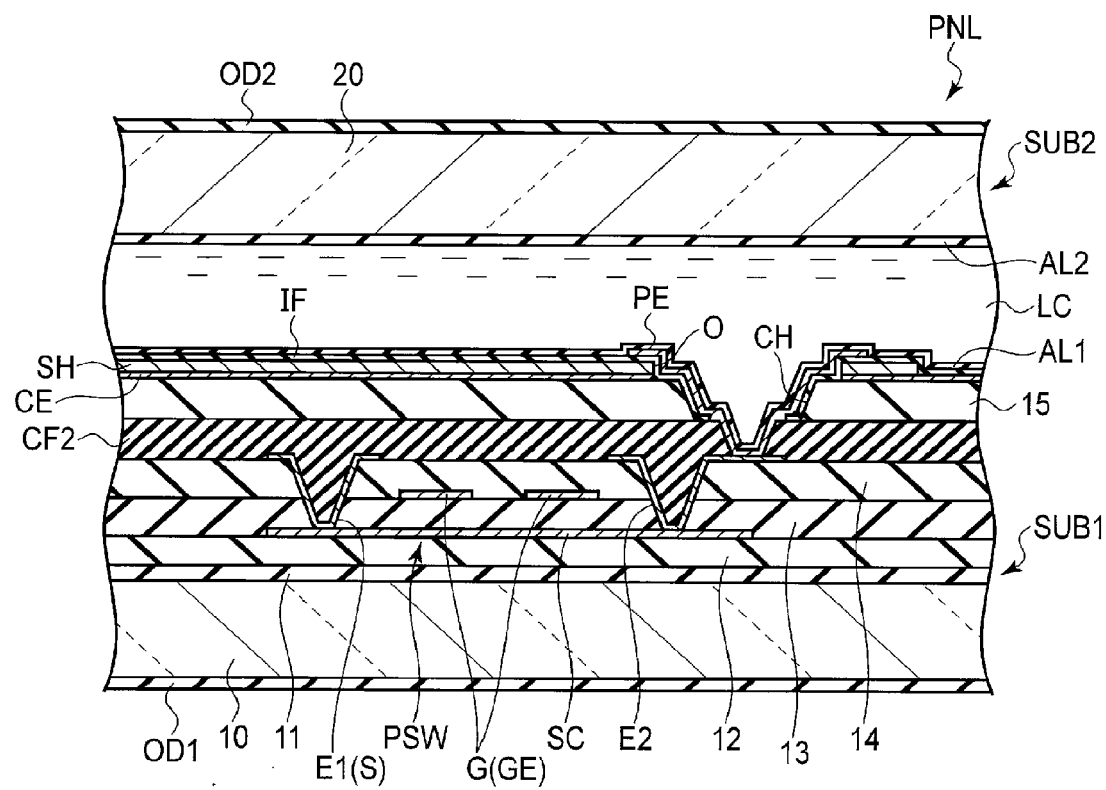
FIG. 9 is another cross-sectional view of the liquid crystal display panel, which is taken along line IX-IX in FIG. 5.

FIG. 9 is a cross-sectional view of the liquid crystal display panel PNL which is taken along line IX-IX in FIG. 5. The following explanation is given mainly with respect to structural elements different from those illustrated in the cross-sectional view of FIG. 8. It should be noted that FIG. 9 also illustrates only structural elements which need to be referred to in the following explanation, and omits the adhesives AD1 and AD2, etc.

As illustrated in FIG. 9, in part of the first substrate SUB1 illustrated in FIG. 9, a pixel switching element PSW is provided. The pixel switching element PSW includes a semiconductor layer SC, a gate electrode GE, etc. The semiconductor layer SC is located between the insulating layers 12 and 13. The semiconductor layer SC is formed of polycrystalline silicon; however, it may be formed of amorphous silicon, an oxide semiconductor or the like.

Two gate electrodes GE corresponding to part of scanning lines G are located between the insulating layers 13 and 14. The scanning lines G are formed of metallic material, for example, a amolmolybdenum tungsten alloy. A first electrode E1 and a second electrode E2 are located between the insulating layers 14 and 15. The first electrode E1 and signal line S are formed as a single body. The first electrode E1 (signal line S) and the second electrode E2 are formed of metallic material. For example, the first electrode (signal line S) and the second electrode E2 are formed of metals, i.e., titanium, aluminum and titanium which are stacked in this order.

The first electrode E1 is in contact with a first region of the semiconductor layer SC through a contact hole formed in the insulating layers 13 and 14. The second electrodes E2 is in contact with a second region of the semiconductor layer SC through another contact hole formed in the insulating layers 13 and 14. In the case where the first electrode E1 and the second electrodes E2 function as a source electrode and a drain electrode, respectively, the first region and the second region function as a source region and a drain region, respectively. Alternatively, in the case where the first electrode E1 and the second electrodes E2 function as a drain electrode and a source electrode, respectively, the first region and the second region function as a drain region and a source region, respectively.

In the embodiment, the pixel switching elements PSW are each formed of a top-gate thin-film transistor. However, each pixel switching element PSW may be formed of a bottom-gate thin-film transistor.

Referring to FIG. 10, the pixel electrode PE is in contact with the second electrode E2 through a contact hole CH formed in the color filter CF2 and the insulating layer 15.

In the above first substrate SUB1, each of pixels having respective colors includes a pixel electrode PE and any of the color filters CF1 to CF3. Furthermore, between the pixel electrodes PE and the color filters CF1 to CF3, the liquid crystal layer LC is not located. Thus, the pixel electrodes PE and the color filters CF1 to CF3 are closer to each other. It is therefore possible to prevent color mixing.

FIG. 10 is an enlarged cross-sectional view illustrating part of the first substrate SUB1 as illustrated in FIG. 8.

As illustrated in FIG. 10, the second lines SHa2 (line group SH) are each formed of a stacked conductive layer. Each of the second lines SHa2 comprises a first conductive layer L1, a second conductive layer L2 and a third conductive layer L3.

The first conductive layer L1 is formed of a material containing aluminum. In the embodiment, the first conductive layer L1 is formed of aluminum, but may be formed of an aluminum alloy. In the first conductive layer L1, the oxygen concentration of a side wall L1$b$ is higher than that of a center portion L1$a$. The side wall L1$b$ is formed of an oxide film. In other words, the side wall L1$b$ is formed of a passive film.

The second conductive layer L2 is provided on the first conductive layer L1. In the embodiment, the second conductive layer L2 is provided on the first conductive layer L1. The second conductive layer L2 is formed of a conductive material different from material of which the first conductive layer L1 is formed. In the embodiment, the second conductive layer L2 is formed of an aluminum nitride, but may be formed of an aluminum alloy nitride. The second conductive layer L2 has a higher visible-light absorptivity than that of the first conductive layer L1. In the second conductive layer L2, the oxygen concentration of a side wall L2$b$ is higher than that of a center portion L2$a$. The side wall L2$b$ is formed of an oxide film. In other words, the side wall L2$b$ is formed of a passive film.

The third conductive layer L3 is provided on the second conductive layer L2. The third conductive layer L3 is formed of a transparent conductive material. Alternatively, the third conductive layer L3 is formed of an oxide having conductivity. In the embodiment, the third conductive layer L3 is formed of indium gallium oxide (IGO).

As seen in plan view, the first conductive layer L1, the second conductive layer L2 and the third conductive layer L3 are superimposed together, and have substantially the same shape and the same size.

In the case of forming such second lines SHa2 (line group SH) as described above, a first conductive film, a second conductive film and a third conductive film are successively formed on a common electrode CE, and a resist mask is formed on the third conductive film, the first conductive film being formed of aluminum, the second conductive film being formed of an aluminum nitride, the third conductive film being formed of an IGO. The resist mask has a pattern corresponding to the second lines SHa2 (line group SH). Thereafter, in a vacuum environment (decompressed environment), using the resist mask, the lines are subjected to dry processing using gas containing, for example, chlorine, and an oxygen plasma processing is performed to remove the resist mask with an asher.

Thereby, second lines SHa2 (line group SH) are formed. It should be noted that although ashing can be performed by an oxygen plasma processing, the side surface of the first conductive layer L1 and that of the second conductive layer L2 are processed in the same processing step. To be more specific, by the oxygen plasma processing, the side wall L1$b$ and the side wall L2$b$ are oxidized (oxidation treatment). It should be noted that the oxidation treatment is also performed on inner wall portions of the first and second conductive layers L1 and L2 in which the openings O are to be formed.

Furthermore, in the above example, etching of the first to third conductive films and the oxidation treatment are performed in the same step; however, they may be performed in different steps. For example, it may be set that in atmospheric-pressure environment, after wet-etching the first to third conductive films, the side wall L1$b$ and the side wall L2$b$ are oxidized (oxidation treatment) by performing an oxygen plasma processing. In this case, it is preferable that the oxygen plasma processing for the above oxidation treatment be performed in a vacuum environment (depressed environment). However, the oxygen plasma processing may be performed in the atmosphere. In this case also, the above oxidation treatment can be carried out.

Furthermore, as the oxidation treatment, anodic oxidation processing can also be applied.

The line group SH formed in the above manner are located in the display area DA, and include the second conductive layers L2 located on first conductive layers L1. Since the reflectance at which the line group SH reflect light upwards can be reduced, the line group SH can become hard to visibly recognize. The line group SH (line portions SHa) extend along the above scanning lines G and signal lines S, and are located opposite to the scanning lines G and the signal lines S. The line group SH can reduce reflection of light by the scanning lines G and the signal lines S.

Thereby, it is possible to obtain, for example, a high contrast ratio. Alternatively, it is possible to form the second substrate SUB2 without a light-shielding layer referred to as a black matrix, or to reduce the area in which a light-shielding layer is provided. The light-shielding layer is located in the display area DA, and extends along the boundaries between the color filters CF1 to CF3. It is therefore possible to reduce lowering of the aperture ratio.

On side walls of the line group SH, passive films are formed by an oxidation treatment. It is also therefore possible to obtain a line group SH in which electrolytic corrosion does not easily occur.

The entire surface of the line group SH is formed of oxides, and the line group SH is not easily eroded by water. Therefore, pads in the non-display area NDA may be formed in the same manufacturing step as the line group SH. It is possible to obtain pads which are not easily eroded.

The width W2 of the second line SHa2 is not specified; however, they may be greater than or equal to the width W1 of the signal line S. It should be noted that each of the widths corresponds to a length in the first direction X. The second line SHa2 satisfies such a relationship as described above, and at the same time, the second lines SHa2 are superimposed on substantially the entire signal lines S as seen in plan view. It should be noted that as seen in plan view, the first lines SHa1 are superimposed on substantially the entire scanning lines G. Furthermore, in order to reduce reflection at the side surfaces of the signal lines S, it is preferable that the width W2 be greater than the width W1.

In addition, according to the embodiment, the second lines SHa2 (line group SH) include not only the first conductive layers L1 and the second conductive layers L2 but the third conductive layers L3. For example, the reflective index of each of the third conductive layer L3 is approximately 1.5 to 2.0. By virtue of the third conductive layer L3, it is possible to obtain an interference effect of reflected light.

An interference phenomenon of reflected light occurs when first reflected light and second reflected light interfere with each other, the first reflected light being reflected at the surface of the third conductive layer L3, the second reflected light being transmitted through the third conductive layer L3, then reflected at the surface of the second conductive layer L2, and emitted from the surface of the third conductive layer L3. Thus, if the phase difference in wavelength between the first reflected light and the second reflected light is 0.5, they cancel each other, thereby reducing the intensity of the reflected light. From the above point of view, it is preferable that the second line SHa2 (groups of lines SH) includes third conductive layer L3. If so, it is possible to reduce lowering of the display quality.

Figure 11:
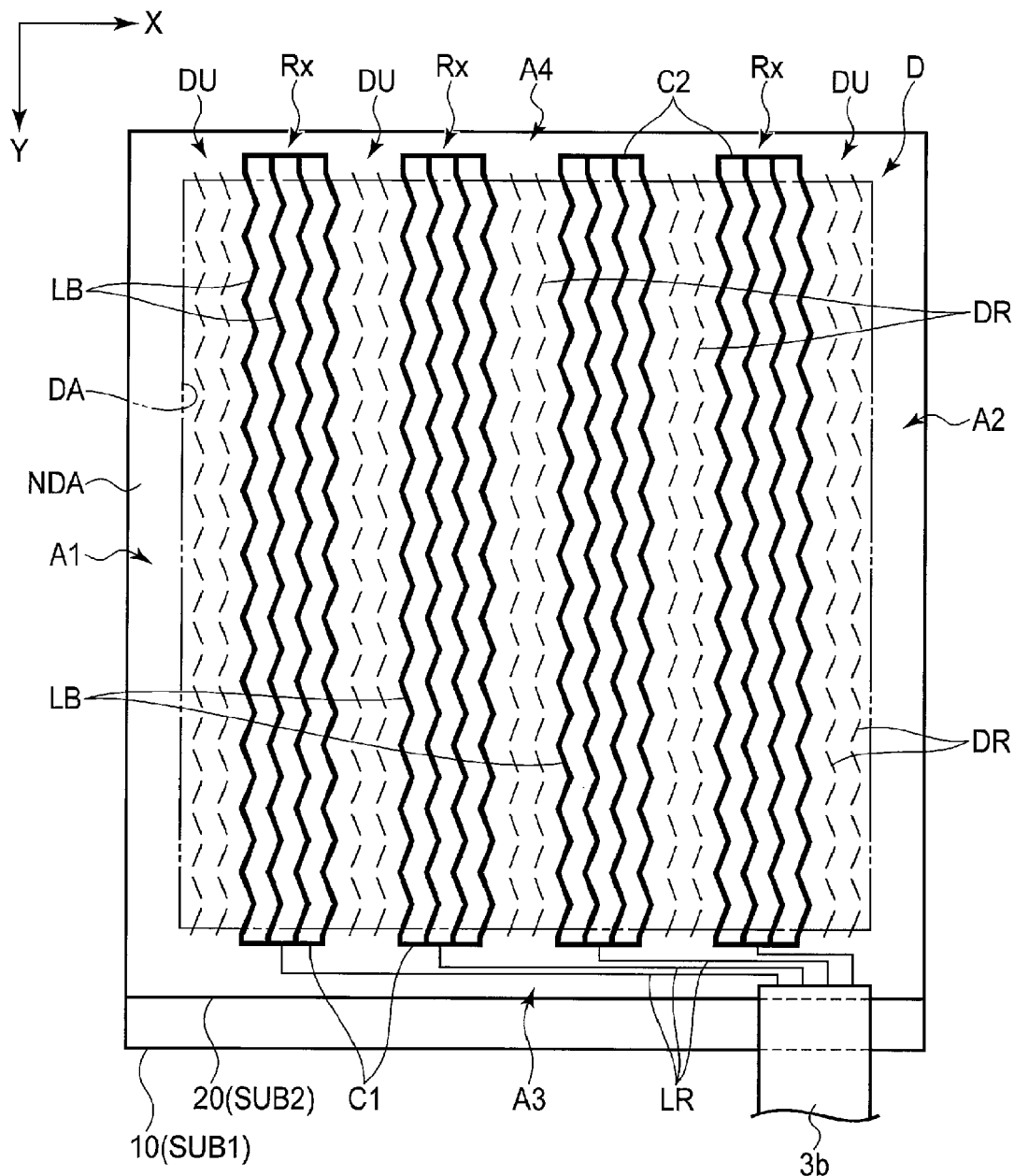
FIG. 11 is a plan view illustrating part of the liquid crystal display device, and also a view illustrating the first insulating substrate, a second insulating substrate, a detection unit and a second branch portion of a flexible printed circuit.

FIG. 11 is a plan view illustrating part of the liquid crystal display device DSP, and also a view illustrating the first insulating substrate 10, the second insulating substrate 20, the detection unit D and the second branch portion 3b of the flexible printed circuit 3. It should be noted that in FIG. 11, the detection unit D, etc., are illustrated as seen in plan view.

As illustrated in FIG. 11, the detection unit D comprises a plurality of detection electrodes Rx, a plurality of dummy portions DU and a plurality of lead lines LR. The detection electrodes Rx are each strip-shaped, extend in the second direction Y, and are arranged and spaced from each other in the first direction X. The detection electrodes Rx can be capacitive-coupled to, for example, the common electrodes CE.

In the embodiment, the detection electrodes Rx include detection lines LB, connection lines C1 connected to the lead lines LR and other connection lines C2. The connection lines C1 are located in the third area A3, and the connection lines C2 are located in a fourth area A4. In the display area DA, the detection lines LB extends in substantially the second direction Y; in the third area A3, they are connected to the connection lines C1; and in the fourth area A4, they are connected to the connection lines C2. In the example illustrated in FIG. 11, each of the detection lines LB is formed in a wavelike fashion (to be more specific, in a triangular wavelike fashion.). The detection lines LB are arranged at substantially regular intervals in the first direction X. Each of the detection electrodes Rx includes four detection lines.

The lead lines LR are located in the non-display area NDA, and electrically connect the detection electrodes Rx to the second branch portion 3b. In the embodiment, the lead lines LR are respectively connected to the detection electrodes RX. Also, in the embodiment, the lead lines LR extend in the third area A3.

Each of the dummy portions DU is located between, for example, associated adjacent detection electrodes Rx. It is preferable that the dummy portions DU be formed at least in all areas of the display area DA in which the detection electrodes Rx are not formed. Dummy electrodes DR are formed of dummy lines which are located substantially parallel to the detection lines LB and at substantially regular intervals. For example, the dummy lines are arranged in the first direction X, extend in the second direction Y, and are formed in a wavelike fashion (to be more specific, in a triangular wavelike fashion), and divided into a plurality of portions. The dummy lines are not connected to lines such as the lead lines LR, and are in an electrically floating state.

The dummy electrodes DR do not contribute to detection of an object which is in contact with or proximity to the display panel. Thus, from the standpoint of detection of the object, it is not necessary to provide the dummy electrodes DR. However, if the dummy electrodes DR are not provided, there is a possibility that an image will not be uniformly displayed on the screen of the liquid crystal display panel PNL. Thus, preferably, the dummy electrodes DR should be provided.

Thereby, it is possible to further reduce the variance between the densities of narrow lines (the detection lines LB and the dummy lines) in the display area DA, as a result of which the pattern of the narrow lines become hard to visibly recognize. It suffices that the dummy electrodes DR (dummy lines) are provided as occasion demands.

With respect to the embodiment, the above configuration of the detection electrodes Rx and the dummy electrodes DR is described by way of example, and the configuration of the detection electrodes Rx, etc., can be variously modified. For example, with respect to the detection electrodes Rx, the shapes of the detection lines LB can be modified, and the number of the detection lines LB can be increased or decreased. The detection electrodes Rx may be formed in a mesh manner, and the dummy electrodes DR may also be formed in a mesh manner.

In the embodiment, the detection electrodes Rx (the detection lines LB and the connection lines C1 and C2), the dummy electrodes DR (dummy lines) and the lead lines LR are formed of a metallic material which is a conductive material. In such a manner, since the detection electrodes Rx are formed of a metallic material, the electrical resistances can be reduced, thus reducing the time required for detection. In this regard, it is desirable. Furthermore, since the detection electrodes Rx are formed of a metallic material, it is advantageous in formation of larger liquid crystal display panels PNL and formation of higher definition liquid crystal display panels PNL.

Furthermore, in the embodiment, the detection line LB and the dummy line have the same width. However, in FIG. 11, the detection lines LB are depicted to have different widths than those of the dummy lines, in order that they be visibly distinguished from each other.

FIG. 12 is an enlarged cross-sectional view illustrating part of the second substrate SUB2 as illustrated in FIG. 11. It should be noted that the detection lines LB, the connection lines C1 and C2, the dummy lines and the lead lines LR are formed in the same step at the same time. Thus, the detection lines LB, the connection lines C1 and C2, the dummy lines and the lead lines LR are formed in the same manner. With respect to the detection lines LB, the connection lines C1 and C2, the dummy lines and the lead lines LR, the detection lines LB will be representatively explained.

As illustrated in FIG. 12, each of the detection lines LB is formed above the second insulating substrate 20. In the embodiment, the detection lines LB are formed on the second insulating substrate 20. The manufacturing method and structure of the detection lines LB are the same as the above-mentioned line group SH. Each detection line LB is formed of a stacked conductive layer. Each detection line LB comprises a first conductive layer L11, a second conductive layer L12 and a third conductive layer L13.

The first conductive layer L11 is formed of material containing aluminum, and located on the second insulating substrate 20. In the embodiment, the first conductive layer L11 is formed of aluminum, but may be formed of an aluminum alloy. In the first conductive layer L11, the oxygen concentration of a side wall L11b is higher than that of a center portion L11a. The side wall L11b is formed of an oxide film (passive film).

The second conductive layer L12 is provided on the first conductive layer L11. The second conductive layer L12 is formed of a conductive material different from material of which the first conductive layer L11 is formed. In the embodiment, the second conductive layer L12 is formed of an aluminum nitride, but may be formed of an aluminum alloy nitride. The second conductive layer L12 has a higher visible-light absorptivity than that of the first conductive layer L11. In the second conductive layer L12, the oxygen concentration of a side wall L12b is higher than that of a center portion L12a. The side wall L12b is formed of an oxide film (passive film).

The third conductive layer L13 is provided on the second conductive layer L12. The third conductive layer L13 is formed of a transparent conductive material. Alternatively, the third conductive layer L13 is formed of an oxide having conductivity. In the embodiment, the third conductive layer L13 is formed of IGO.

As seen in plan view, the first conductive layer L11, the second conductive layer L12 and the third conductive layer L13 are superimposed together, and have substantially the same shape and the same size.

The detection lines LB formed in the above manner are located in the display area DA, and include the second conductive layers L12 located on the first conductive layers L11. The reflectance at which the detection lines LB reflect light upwards can be reduced. Thereby, it is possible to obtain, for example, a high contrast ratio.

On side walls of the detection lines LB, passive films are formed by an oxidation treatment. It is also therefore possible to obtain detection lines LB in which electrolytic corrosion does not easily occur.

The entire surface of the detection line LB is formed of oxides, and the detection line LB is not easily eroded by water. It is therefore possible to obtain detection lines LB which will not be easily eroded. From the above, for example, pads for use in connection to the second branch portion 3b may be formed in the same step as the detection lines LB.

Furthermore, according to the embodiment, the detection lines LB comprises not only the first and second conductive layers L11 and L12 but the third conductive layers L13. For example, the reflective index of each of the third conductive layers L3 is approximately 1.5 to 2.0. By virtue of the third conductive layers L13, it is possible to obtain an interference effect of reflected light. As an advantage, it is possible to reduce the intensity of reflected light at the detection lines LB. From the above point of view, it is preferable that the detection lines LB comprise third conductive layers L13. If so, it is possible to reduce lowering of the display quality.

Next, it will be explained how the above liquid crystal display device DSP adapted for the FFS mode operates during its display drive operation for displaying an image.

First of all, an off state in which no voltage is applied to the liquid crystal layer LC will be explained. The off state corresponds to a state in which a potential difference is not made between the pixel electrodes PE and the common electrodes CE. In such an off state, liquid crystal molecules contained in the liquid crystal layer LC are initially aligned in a single direction in the X-Y plane by alignment forces of the alignment films of the first substrate SUB1 and second substrate SUB2. Part of light emitted from the backlight unit BL is transmitted through the polarizer of the first optical element OD1, and then incident on the liquid crystal display panel PNL. The light incident on the liquid crystal display panel PNL is linear polarized light perpendicular to the absorption axis of the polarizer. The polarized state of such linear polarized light hardly changes when the light passes through the liquid crystal display panel PNL in the case where the liquid crystal display panel PNL is in the off state. Thus, most of the linear polarized light which has passed through the liquid crystal display panel PNL is absorbed by the polarizer of the second optical element OD2 (black display). A mode in which the liquid crystal panel PNL makes black display in the off state is referred to as a normally-black mode.

Then, an on state in which a voltage is applied to the liquid crystal layer LC will be explained. The on state corresponds to a state in which a potential difference is made between the pixel electrodes PE and the common electrodes CE. To be more specific, to the common electrodes CE, a common drive signal (common voltage) is supplied from the common-electrode drive circuit CD. By contrast, the pixel electrodes PE are supplied with such an image signal (for example, a video signal) as makes the potential difference with respect to the common voltage. As a result, in the on state, a fringing field is produced between the pixel electrodes PE and the common electrodes CE.

In such an on state, in the X-Y plane, liquid crystal molecules are aligned in a direction different from that in their initial alignment state. In the on state, linear polarized light perpendicular to the absorption axis of the polarizer of the first optical element OD1 is incident on the liquid crystal display panel PNL, and its polarized state varies in accordance with the alignment state of the liquid crystal molecules when it passes through the liquid crystal layer LC. Thus, in the on state, at least part of the light which has passed through the liquid crystal layer LC also passes through the polarizer of the second optical element OD2 (white display).

Next, it will be explained how the liquid crystal display device DSP operates at the time of performing a sensing drive to carry out sensing for detecting contact or proximity of a conductive object with or to the input surface IS of the liquid crystal display device DSP. To be more specific, a controller which is made up of the control module CM and the driver IC 1 and the driver IC 2 of the liquid crystal display device DSP effects switching between a first mode and a second mode to control driving of the common electrodes CE and the detection electrodes Rx, and perform sensing. It should be noted that there is a case where the first mode and second mode are referred to as a self-capacitive sensing mode and a mutual-capacitive sensing mode, respectively.

(First Mode)

The first mode will be explained, which is a mode in which first input position information is detected by the detection unit D. The first mode is featured in that the entire input area is subjected to detection, and an input position can be roughly detected for a short time period. FIG. 13 is a view for explaining a principle of an example of a sensing method in the first mode. FIG. 14 is another view for explaining the principle of the example of the sensing method in the first mode, following FIG. 13.

As illustrated in FIG. 13, first, the driver IC 2 writes a write signal Vw to each of the detection electrodes Rx. Then, as illustrated in FIG. 14, the driver IC 2 reads a read signal Vr from the detection electrodes Rx. It should be noted that the read signal Vr indicates a variation of a sensing signal which is made by the write signal Vw at the detection electrodes Rx.

In the example illustrated in FIGS. 13 and 14, a user's finger is brought close to the second detection electrode Rx from the right, and capacitive coupling occurs between the detection electrode Rx and the finger. In a read signal Vr read from the second detection electrodes Rx from the right, a voltage value more greatly changes than in read signals Vr read from other detection electrodes Rx. It is therefore possible to determine an area located opposite to the second detection electrode Rx, as the X coordinate of an input position. That is, in the area located opposite to the detection electrodes Rx, it can be detected that the finger has been in contact with or proximity to the input surface IS of the liquid crystal display device DSP.

As described above, in the first mode, the input position can be roughly detected using the detection unit D.

(Second Mode)

Figure 15:
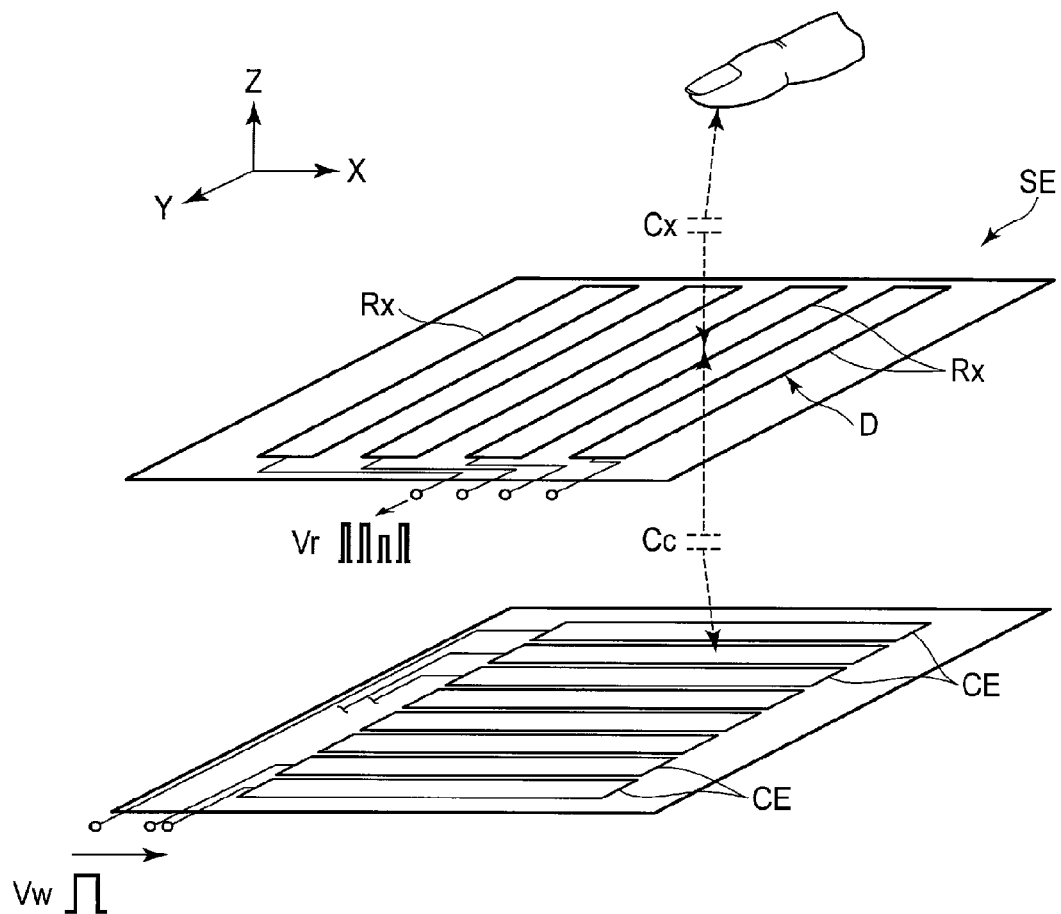
FIG. 15 is a view for explaining a principle of an example of a sensing method in a second mode.

The second mode will be explained, which is a mode in which second input position information is detected by a combination of the common electrodes CE and the detection unit D. The second mode is featured in that at least part of the input area is subjected to detection, and X and Y coordinates of an input position can be detected in detail. FIG. 15 is a view for explaining a principle of an example of a sensing method in the second mode.

As illustrated in FIG. 15, a capacitance Cc is present between a common electrode CE and a detection electrode Rx. That is, the detection electrode Rx is capacitive-coupled to the common electrode CE. In the example illustrated in FIG. 15, a user's finger is located close to a location where the second common electrode CE from the top and the second detection electrode Rx from the right cross each other. When the user's finger is brought close to the detection electrode Rx, a coupling capacitance Cx is produced.

First, the driver IC 1 writes a pulse write signal (sensor drive signal) Vw to the common electrode CE to cause a sensor signal to be produced between the common electrode CE and the detection electrode Rx. Next, the driver IC 2 reads from the detection electrode Rx, a read signal Vr indicating a change of a sensor signal (for example, a capacitance produced in the detection electrode Rx). In other words, the driver IC 2 detects a sensor output value of the detection electrode Rx. The second input position information can be detected based on timing at which the write signal Vw is supplied to the common electrodes CE and read signals Vr from the detection electrodes.

According to the embodiment, the liquid crystal display device DSP having the above structure comprises the line group SH and the detection unit D. The first lines SHa1 and second lines SHa2 of the line group SH are each formed of a stacked conductive layer comprising a first conductive layer L1, a second conductive layer L2 and a third conductive layer L3. The detection lines LB, the connection lines C1 and C2, the dummy lines and the lead lines LR of the detection unit D are each formed of a stacked conductive layer comprising a first conductive layer L11, a second conductive layer L12 and a third conductive layer L13.

The line group SH each comprises at least a first conductive layer L1 and a second conductive layer L2.

The detection unit D comprises at least first and second conductive layers L11 and L12. At least the side wall L1b of the first conductive layer L1 and the side wall L11b of the first conductive layer L11 are each formed of a passive film. The passive film can be formed by a simple method, for example, an oxygen plasma processing. It is therefore possible to obtain a line group SH and a detection unit D, in which lowering of the display quality can be reduced, and electrolytic corrosion or corrosion does not easily occur.

The line group SH each further comprise a third conductive layer L3, and the detection unit D further comprises a third conductive layer L13. This can reduce the intensity of light reflected at the line group SH or the detection unit D, because of an interference effect. Thereby, it is possible to further reduce lowering of the display quality.

By virtue of the above features, it is possible to obtain a liquid crystal display device DSP in which deterioration of conductive layers can be reduced. Alternatively, it is possible to obtain a liquid crystal display device DSP which achieves a good display quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the line group SH and the detection unit D may be each formed of four or more conductive layers. In the following, with respect to modifications of the line group SH and the detection unit D, an example of a modification of the detection unit D is representatively explained.

Figure 16:
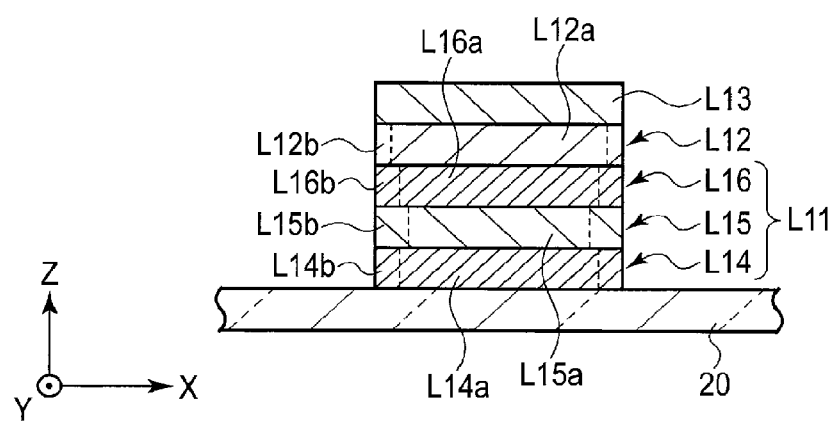
FIG. 16 is a cross-sectional view illustrating a modification of detection lines as illustrated in FIG. 12, and a view illustrating the detection lines and the second insulating substrate.

As illustrated in FIG. 16, the first conductive layer L11 of each of the detection lines LB may have a stacked structure including a fourth conductive layer L14, a fifth conductive layer L15 and a sixth conductive layer L16.

The fourth conductive layer L14 is located between the second insulating substrate 20 and the second conductive layer L12. The fourth conductive layer L14 is formed of, for example, titanium. In the fourth conductive layer L14, the oxygen concentration of a side wall L14b is higher than that of a center portion L14a. The side wall L14b is formed of an oxide film (passive film).

The fifth conductive layer L15 is located between the fourth conductive layer L14 and the second conductive layer L12, and provided on the fourth conductive layer L14. The fifth conductive layer L15 is formed of a conductive material different from material of which the fourth conductive layer L14 is formed. The fifth conductive layer L15 is formed of, for example, aluminum or an aluminum alloy. In the fifth conductive layer L15, the oxygen concentration of a side wall L15b is higher than that of a center portion L15a. The side wall L15b is formed of an oxide film (passive film).

The sixth conductive layer L16 is located between the fifth conductive layer L15 and the second conductive layer L12, and also in contact with the fifth conductive layer L15 and the second conductive layer L12. The sixth conductive layer L16 is formed of a conductive material different from materials of which the fifth conductive layer L15 and the second conductive layer L12 are formed. The sixth conductive layer L16 is formed of, for example, titanium. In the sixth conductive layer L16, the oxygen concentration of a side wall L16b is higher than that of a center portion L16a. The side wall L16b is formed of an oxide film (passive film).

The second conductive layer L12 is formed of, for example, a titanium nitride or an aluminum nitride. The second conductive layer L12 has a higher visible-light absorptivity than that of the sixth conductive layer L16.

Also, in the case of using the detection lines LB as illustrated in FIG. 16, it is possible to obtain the same advantage as in the case of using the detection lines LB according to the above embodiment.

The line group SH may be formed without including the third conductive layer L3. Similarly, the detection unit D may be formed without including the third conductively layer L13. In this case, oxide films may be formed on upper surfaces of the second conductive layers L2 and L12. However, it is necessary to note that the conductivities of the upper surfaces of the second conductive layers L2 and L12 are reduced.

Furthermore, conductive members other than the line group SH and the detection unit D may be each formed of the above stacked conductive layer.

The driver IC 1 and the driver IC 2 may be formed of a single body. That is, the driver IC 1 and the driver IC 2 may be combined into a single drive IC. In this case, it suffices that the single drive IC is connected to the liquid crystal display panel PNL, the detection unit D and the control module CM, and can supply a common drive signal Vcom to the common electrodes CE, write a write signal to the common electrodes CE or the detection electrodes Rx, and read a write signal from the detection electrodes Rx.

The above controller is not limited to a controller comprising the driver IC 1, the driver IC 2 and the control module CM, and can be variously modified. It suffices that the controller can control the sensor SE.

With respect to the above embodiment, as the display device, the liquid crystal display device DSP including the sensor SE is described above by way of example. However, in the embodiment, it is also possible to apply a liquid crystal display device DSP which is formed without the sensor SE. Furthermore, the above embodiment can be applied to various flat panel display devices such as an organic electroluminescent (EL) display device, another type of self-luminous display device, and an electronic paper display device including electrophoresis elements. Needless to say, the above embodiment can be applied to middle or small display devices and large display devices without particular limitation.

What is claimed is:

1. A display device comprising a stacked conductive layer, the stacked conductive layer comprising:
   a first conductive layer formed of material containing aluminum; and
   a second conductive layer provided on the first conductive layer, formed of material different from material of which the first conductive layer is formed, and having a higher visible-light absorptivity than that of the first conductive layer,
   the first conductive layer including a side wall formed of an oxide film.

2. The display device of claim 1, wherein the second conductive layer includes a side wall formed of an oxide film.

3. The display device of claim 1, wherein the stacked conductive layer further comprises a third conductive layer provided on the second conductive layer and formed of a transparent conductive material.

4. The display device of claim 3, wherein the third conductive layer is formed of an oxide.

5. The display device of claim 1, wherein the first conductive layer is formed of one of aluminum and an aluminum alloy.

6. The display device of claim 1, wherein the second conductive layer is formed of an aluminum nitride.

7. The display device of claim 1, further comprising:
   a first substrate;
   a second substrate located above the first substrate and opposite to the first substrate; and
   a detection electrode located above the second substrate, wherein the detection electrode is formed of the stacked conductive layer.

8. The display device of claim 1, further comprising:
   a first substrate including a drive electrode and a pixel electrode located opposite to the drive electrode;
   a second substrate located above the first substrate and opposite to the first substrate;
   a liquid crystal layer held between the first substrate and the second substrate;
   a detection electrode located above the second substrate,
   a driver which supplies a common drive signal to the drive electrode and supplies an image signal to the pixel electrode at a display drive time at which an image is displayed; and
   a controller which supplies a sensor drive signal to the drive electrode and detects a sensor output value of the detection electrode at a sensing drive time at which sensing is performed,
   wherein the detection electrode is formed of the stacked conductive layer.

9. The display device of claim 1, further comprising:
   a first substrate;
   a second substrate located above the first substrate and opposite to the first substrate; and
   a liquid crystal layer held between the first substrate and the second substrate,
   wherein the first substrate comprises:
   a scanning line formed of metal;
   a signal line formed of metal and located above the scanning line; and
   a line portion located above the signal line,
   the line portion being formed of the stacked conductive layer.

10. The display device of claim 9, wherein
    the scanning line extends in a first direction,
    the signal line extends in a second direction crossing the first direction, and
    the line portion extends along the scanning line and the signal line, respectively, and is located opposite to the scanning line and the signal line, respectively.

11. A display device comprising a stacked conductive layer,
    the stacked conductive layer comprising:
    a first conductive layer formed of material containing aluminum;
    a second conductive layer provided on the first conductive layer, formed of material different from material of which the first conductive layer is formed, and having a higher visible-light absorptivity than that of the first conductive layer,
    the first conductive layer including a side wall having a higher oxygen concentration than that of a center portion of the first conductive layer.

12. The display device of claim 11, wherein the second conductive layer includes a side wall having a higher oxygen concentration than that of a center portion of the second conductive layer.

13. The display device of claim 11, wherein the stacked conductive layer further comprises a third conductive layer provided on the second conductive layer and formed of a transparent conductive material.

14. The display device of claim 13, wherein the third conductive layer is formed of an oxide.

15. The display device of claim 11, wherein the first conductive layer is formed of one of aluminum and an aluminum alloy.

16. The display device of claim 11, wherein the second conductive layer is formed of an aluminum nitride.

17. The display device of claim 11, further comprising:
    a first substrate;
    a second substrate located above the first substrate and opposite to the first substrate; and a detection electrode located above the second substrate,
wherein the detection electrode is formed of the stacked conductive layer.

18. The display device of claim 11, further comprising:
a first substrate including a drive electrode and a pixel electrode located opposite to the drive electrode;
a second substrate located above the first substrate and opposite to the first substrate;
a liquid crystal layer held between the first substrate and the second substrate;
a detection electrode located above the second substrate,
a driver which supplies a common drive signal to the drive electrode and supplies an image signal to the pixel electrode at a display drive time at which an image is displayed; and
a controller which supplies a sensor drive signal to the drive electrode and detects a sensor output value of the detection electrode at a sensing drive time at which sensing is performed,
wherein the detection electrode is formed of the stacked conductive layer.

19. The display device of claim 11, further comprising:
a first substrate;
a second substrate located above the first substrate and opposite to the first substrate; and
a liquid crystal layer held between the first substrate and the second substrate,
wherein the first substrate comprises:
a scanning line formed of metal;
a signal line formed of metal and located above the scanning line; and
a line portion located above the signal line,
the line portion being formed of the stacked conductive layer.

20. The display device of claim 19, wherein
the scanning line extends in a first direction,
the signal line extends in a second direction crossing the first direction, and
the line portion extends along the scanning line and the signal line, respectively, and is located opposite to the scanning line and the signal line, respectively.

* * * * *